(12) United States Patent
Akiyama et al.

(10) Patent No.: US 8,106,454 B2
(45) Date of Patent: Jan. 31, 2012

(54) POWER SEMICONDUCTOR DEVICE AND METHOD FOR MANUFACTURING SAME

(75) Inventors: Miwako Akiyama, Tokyo (JP); Yusuke Kawaguchi, Kanagawa-ken (JP); Yoshihiro Yamaguchi, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 12/266,331

(22) Filed: Nov. 6, 2008

(65) Prior Publication Data
US 2009/0127616 A1     May 21, 2009

(30) Foreign Application Priority Data

Nov. 7, 2007   (JP) .................................. 2007-289198

(51) Int. Cl.
*H01L 29/00* (2006.01)
(52) U.S. Cl. . 257/341; 257/492; 257/493; 257/E29.012; 257/E29.198
(58) Field of Classification Search .................. 257/330, 257/341, 342, 492, 493, E29.012, E29.198
See application file for complete search history.

(56) References Cited

U.S. PATENT DOCUMENTS

| 2006/0151831 | A1 | 7/2006 | Ninomiya et al. |
| 2006/0231917 | A1* | 10/2006 | Ono et al. .................. 257/500 |
| 2007/0029543 | A1 | 2/2007 | Ninomiya et al. |
| 2007/0238271 | A1* | 10/2007 | Yamauchi et al. .......... 438/494 |

FOREIGN PATENT DOCUMENTS

| JP | 2002-083963 | 3/2002 |
| JP | 2006-278826 | 10/2006 |

* cited by examiner

*Primary Examiner* — Minh-Loan T Tran
(74) *Attorney, Agent, or Firm* — Patterson & Sheridan, LLP (57) ABSTRACT

A vertical power semiconductor device includes a first semiconductor layer of a first conductivity type formed in both a cell section and a termination section, the termination section surrounding the cell section, a second semiconductor layer of a second conductivity type formed on the first semiconductor layer in the cell section, a third semiconductor layer of the first conductivity type formed in part on the second semiconductor layer, and a guard ring layer of the second conductivity type formed on the first semiconductor layer in the termination section. Net impurity concentration in the guard ring layer is generally sloped so as to be relatively high on its lower side and relatively low on its upper side. Alternatively, the net impurity concentration in the guard ring layer is constant.

12 Claims, 9 Drawing Sheets

POWER SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2007-289198, filed on Nov. 7, 2007; the entire contents of which are incorporated herein by reference.

BACKGROUND OF THE INVENTION

1. Field of the Invention

This invention relates to a vertical power semiconductor device having a guard ring layer in its termination section and a method for manufacturing the same.

2. Background Art

The low breakdown voltage MOSFET (metal oxide semiconductor field effect transistor) is widely used in notebook personal computers, AC adaptors for LCD (liquid crystal display), and switching power supplies for servers, and is subjected to demands for reduced on-resistance and increased operating speed.

In a conventional low breakdown voltage MOSFET, the channel resistance accounts for a large proportion of the on-resistance. Hence, reduction of on-resistance has been achieved by reducing the channel resistance by downscaling, for example. After the channel resistance was reduced to a certain level, reduction of the drift resistance has been required.

One of the methods for reducing the drift resistance is to use the super junction structure (hereinafter also referred to as "SJ structure"), which has a proven performance in high breakdown voltage MOSFET (see, e.g., JP-A2006-278826 (Kokai)). The SJ structure is a structure in which, for example, P-type pillar layers are periodically arrayed in an N-type semiconductor layer. In the SJ structure, the depletion layer can be extended horizontally from the interface between the P-type pillar layer and the N-type semiconductor layer. In contrast, without pillar layers, the depletion layer extends only vertically from the interface between the N-type semiconductor layer and the P-type base layer. Hence, upon application of the same drain voltage, the SJ structure can extend the depletion layer more widely and achieve a higher breakdown voltage than a structure free from pillar layers. Thus, even for an increased impurity concentration in the N-type semiconductor layer serving as a drift layer, the required breakdown voltage can be maintained, and the drift resistance can be reduced. Also for a low breakdown voltage MOSFET, it has been reported that the semi-SJ structure, in which the P-type pillar layers are formed halfway through the N-type semiconductor layer, can reduce the on-resistance and improve the tradeoff between the breakdown voltage and the on-resistance.

Another method proposed for reducing the drift resistance is to provide a buried electrode below the trench gate and apply to this buried electrode a potential equal to that of the source electrode (see, e.g., JP-A2002-083963(Kokai)). This structure can also achieve the same effect as the SJ structure so that the impurity concentration in the drift layer can be increased to reduce the drift resistance.

However, the SJ structure and the buried electrode structure described above have a problem in that the breakdown voltage of the termination section is decreased with the increase of impurity concentration in the drift layer.

SUMMARY OF THE INVENTION

According to an aspect of the invention, there is provided a vertical power semiconductor device including: a first semiconductor layer of a first conductivity type formed in both a cell section and a termination section, the termination section surrounding the cell section; a second semiconductor layer of a second conductivity type formed on the first semiconductor layer in the cell section; a third semiconductor layer of the first conductivity type formed in part on the second semiconductor layer; and a guard ring layer of the second conductivity type formed on the first semiconductor layer in the termination section, net impurity concentration in the guard ring layer being generally sloped so as to be relatively high on its lower side and relatively low on its upper side, or being constant.

According to another aspect of the invention, there is provided a method for manufacturing a vertical power semiconductor device, including: forming a lower diffusion layer by implanting second-conductivity-type impurity into a termination section of a laminated body made by laminating a first semiconductor layer of a first conductivity type formed in both a cell section and the termination section, the termination section surrounding the cell section, a second semiconductor layer of the second conductivity type formed on the first semiconductor layer in the cell section, and a third semiconductor layer of the first conductivity type formed in part on the second semiconductor layer; and forming an upper diffusion layer on the lower diffusion layer by implanting second-conductivity-type impurity into the first semiconductor layer in the termination section of the laminated body, impurity concentration in the upper diffusion layer being not more than impurity concentration in the lower diffusion layer.

According to still another aspect of the invention, there is provided a method for manufacturing a vertical power semiconductor device, including: forming a second-conductivity-type diffusion layer by implanting second-conductivity-type impurity into a termination section of a laminated body made by laminating a first semiconductor layer of a first conductivity type formed in both a cell section and the termination section, the termination section surrounding the cell section, a second semiconductor layer of the second conductivity type formed on the first semiconductor layer in the cell section, and a third semiconductor layer of the first conductivity type formed in part on the second semiconductor layer; and decreasing the net concentration of the second-conductivity-type impurity in an upper portion of the second-conductivity-type diffusion layer by implanting first-conductivity-type impurity into the first semiconductor layer in the termination section of the laminated body.

DETAILED DESCRIPTION OF THE INVENTION

Embodiments of the invention will now be described with reference to the drawings, beginning with a first embodiment of the invention.

Figure 1:
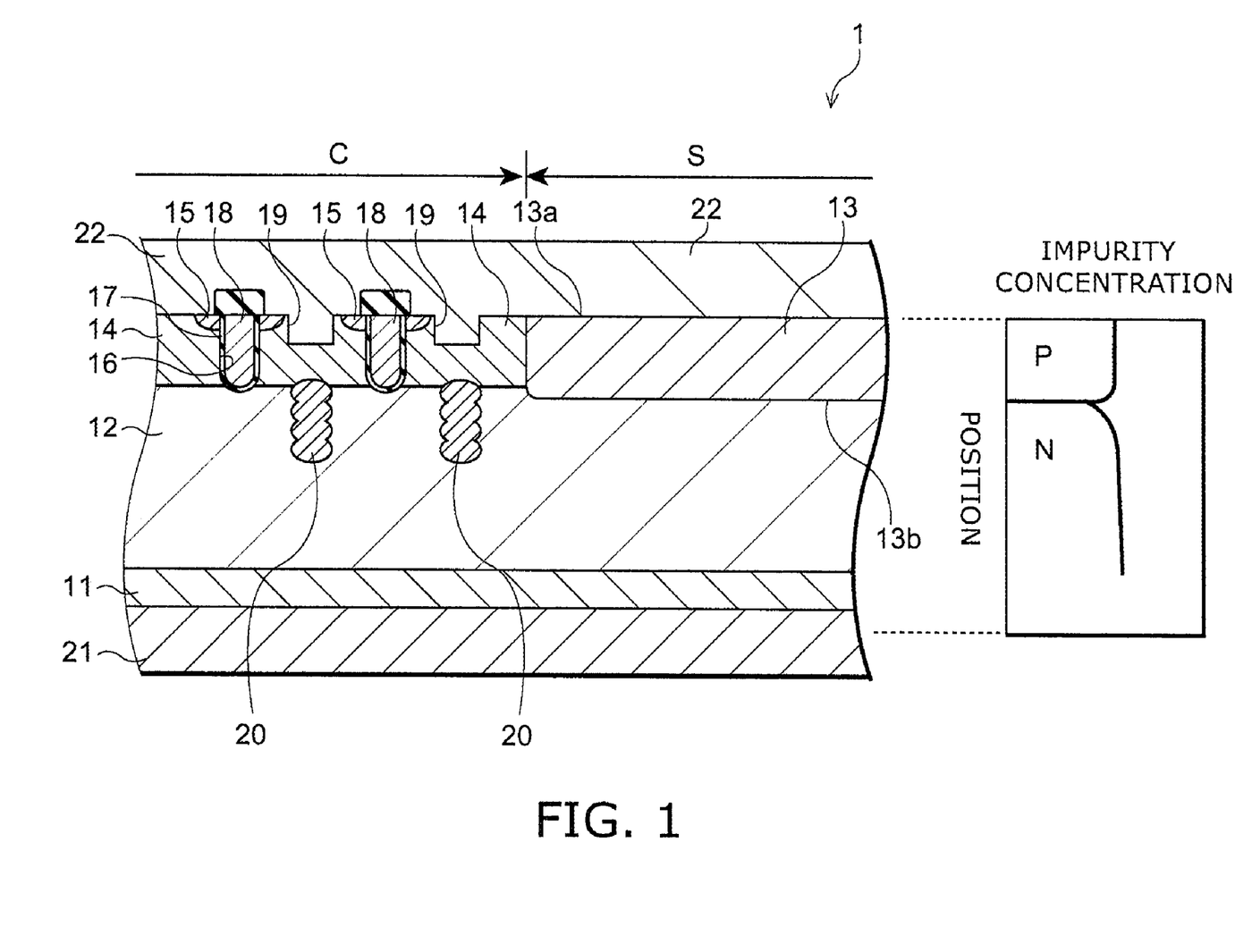
FIG. 1 is a cross-sectional view illustrating a power semiconductor device according to a first embodiment of the invention, and a graph illustrating the net impurity concentration profile of the guard ring layer and the epitaxial layer.

FIG. 1 shows a cross-sectional view illustrating a power semiconductor device according to this embodiment, and a graph illustrating the net impurity concentration profile of the guard ring layer and the epitaxial layer, where the vertical axis represents the position in the termination section of this power semiconductor device, and the horizontal axis represents the net impurity concentration.

In FIG. 1, the position along the vertical axis of the graph corresponds to the vertical position in the cross-sectional view. The same also applies to FIGS. 3, 4, 5, and 10 described below.

As shown in FIG. 1, the power semiconductor device 1 according to this embodiment is a vertical MOSFET. The central section of the power semiconductor device 1 is a cell section C allowing a current to flow therethrough, which is surrounded by a termination section S. The power semiconductor device 1 includes a semiconductor substrate 11 having $N^+$-type conductivity. On the semiconductor substrate 11 is provided an epitaxial layer 12 (first semiconductor layer) having $N^-$-type conductivity and formed by epitaxial growth. The epitaxial layer 12 is formed in both the cell section C and the termination section S.

In the termination section S, a guard ring layer 13 having P-type conductivity is formed on the epitaxial layer 12. As viewed in the direction perpendicular to the top surface of the semiconductor substrate 11 (hereinafter referred to as "vertical direction"), the guard ring 13 is shaped like a ring enclosing the cell section C.

In the guard ring layer 13, the vertical distribution of P-type impurity concentration is generally constant. Hence, the net impurity concentration at the top surface 13a of the guard ring layer 13 is generally equal to the net impurity concentration at the bottom surface 13b of the guard ring layer 13. Here, the "net impurity concentration" refers to the concentration of impurity effectively contributing to electrical conduction.

On the other hand, in the cell section C, a base layer 14 (second semiconductor layer) having P-type conductivity is formed on the epitaxial layer 12. The base layer 14 is connected to the guard ring layer 13, and the bottom surface of the base layer 14 is located higher than the bottom surface 13b of the guard ring layer 13. Furthermore, a source layer 15 (third semiconductor layer) having N-type conductivity is formed in part on the base layer 14.

A gate trench 16 is formed in the epitaxial layer 12, the base layer 14, and the source layer 15 so as to penetrate the source layer 15 and the base layer 14 from the top surface side and reach the epitaxial layer 12. The gate trench 16 is illustratively shaped like a stripe extending perpendicular to the page of FIG. 1. An insulating film 17 is formed on the inner surface of the gate trench 16, and a control electrode 18 is buried inside the gate trench 16. Thus, the control electrode 18 is insulated from the epitaxial layer 12, the base layer 14, and the source layer 15 by the insulating film 17. The insulating film 17 is formed also on the control electrode 18.

Furthermore, a source trench 19 is formed in a region of the top surface of the base layer 14 between the gate trenches 16. The source trench 19 is illustratively shaped like a stripe extending perpendicular to the page of FIG. 1. Moreover, a plurality of pillar layers 20 having P-type conductivity are formed in the epitaxial layer 12 directly below the source trench 19. The pillar layer 20 is illustratively shaped like a stripe extending perpendicular to the page of FIG. 1. The pillar layers 20 are equidistantly spaced from each other and arrayed along the direction parallel to the top surface of the epitaxial layer 12 (hereinafter referred to as "horizontal direction"), with the upper end portions thereof connected to the base layer 14 having likewise P-type conductivity. The net amount of P-type impurity (acceptor) contained in each pillar layer 20 is generally equal to the net amount of N-type impurity (donor) contained in each region of the epitaxial layer 12 between the pillar layers 20. The pillar layers 20 and the epitaxial layer 12 therebetween form a SJ structure.

Furthermore, a source electrode 21 made of a metal or an alloy is provided above the guard ring layer 13, the base layer 14, and the source layer 15, and connected to the guard ring layer 13, the base layer 14, and the source layer 15. On the other hand, a drain electrode 22 made of a metal or an alloy is provided on the bottom surface of the semiconductor substrate 11 and connected to the semiconductor substrate 11.

Next, the operation of the power semiconductor device according to this embodiment is described.

Figure 2A:
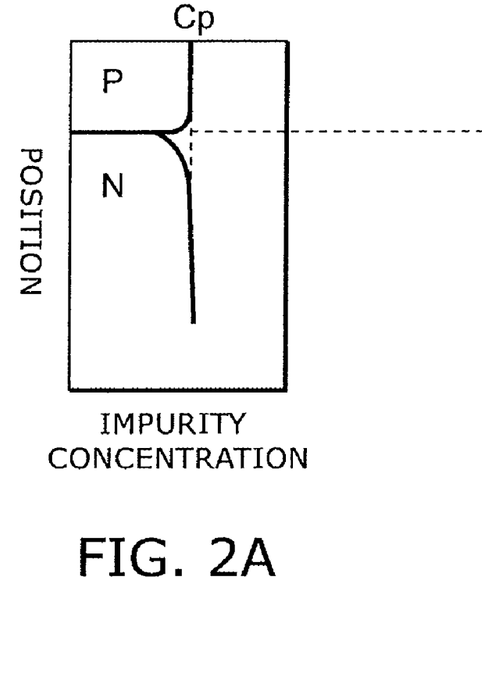
FIG. 2A is the graph illustrating the net concentration distribution profile in this embodiment.
Figure 2B:
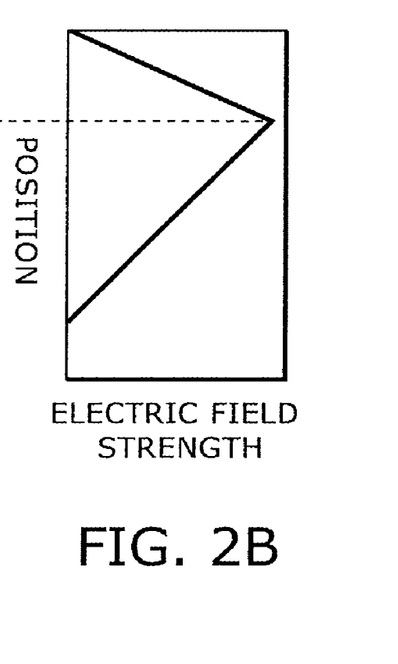
FIG. 2B is a graph illustrating the electric field distribution in this embodiment.
Figure 2C:
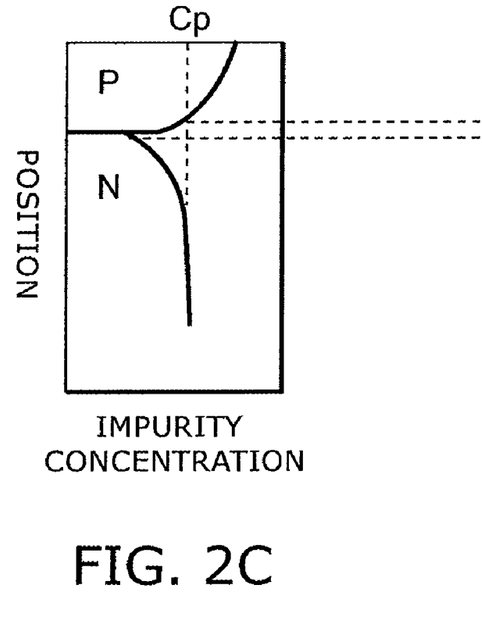
FIG. 2C is a graph illustrating the net concentration distribution profile in a comparative example and FIG. 2D is a graph illustrating the electric field distribution in the comparative example.
Figure 2D:
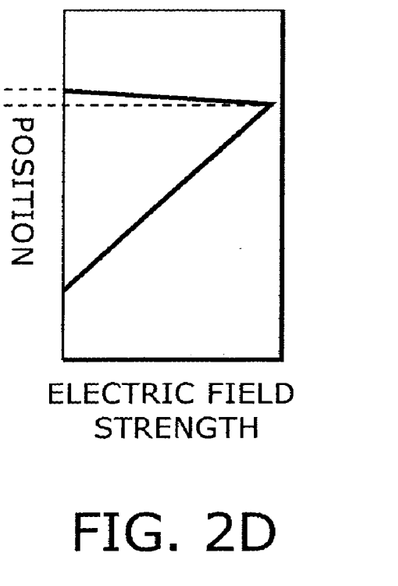

FIG. 2A is the same as the graph shown in FIG. 1, that is, a graph illustrating the concentration distribution profile in this embodiment, where the vertical axis represents the vertical position in the termination section of the power semiconductor device, and the horizontal axis represents the net impurity concentration. FIG. 2B is a graph illustrating the electric field distribution in this embodiment, where the vertical axis represents the vertical position, and the horizontal axis represents the electric field strength. FIG. 2C is a graph illustrating the concentration distribution profile in a comparative example, where the vertical axis represents the vertical position, and the horizontal axis represents the net impurity concentration. FIG. 2D is a graph illustrating the electric field distribution in the comparative example, where the vertical axis represents the vertical position, and the horizontal axis represents the electric field strength.

In the power semiconductor device 1 according to this embodiment, a negative potential is applied to the source electrode 21, and a positive potential is applied to the drain electrode 22. Then, in the termination section S, a depletion layer is generated from the interface between the N⁻-type epitaxial layer 12 and the P-type guard ring layer 13, that is, from the bottom surface 13b of the guard ring layer 13, and extends upward and downward. Here, as shown in FIG. 2A, in this embodiment, the vertical net impurity concentration in the guard ring layer 13 is generally constant. Hence, the depletion layer smoothly extends in the guard ring layer 13 in accordance with the source-drain voltage. For example, let Cp be the critical net impurity concentration at which a depletion layer is generated upon application of a prescribed voltage between the source and the drain. Then, the depletion layer extends throughout the guard ring layer 13 if the net impurity concentration in the guard ring layer 13 is not more than the critical net impurity concentration Cp throughout the vertical length thereof. Consequently, as shown in FIG. 2B, the slope of the electric field strength is uniform throughout the guard ring layer 13, and a high breakdown voltage can be obtained.

In contrast, as shown in FIG. 2C, if the net impurity concentration in the guard ring layer 13 increases in the upward direction, the depletion layer generated at the bottom surface 13b of the guard ring layer 13, that is, its interface with the epitaxial layer 12, is prevented midway from extending upward. That is, the extension of the depletion layer is stopped at the position where the net impurity concentration reaches the critical net impurity concentration Cp. Consequently, as shown in FIG. 2D, no electric field is applied to the region of the guard ring layer 13 in which the depletion layer is not extended, and the overall breakdown voltage is decreased.

Thus, according to this embodiment, the depletion layer is likely to extend throughout the guard ring layer 13, and a high breakdown voltage can be realized. Hence, a power semiconductor device with a high breakdown voltage in the termination section can be obtained. Consequently, breakdown is not likely to occur in the termination section S of the power semiconductor device 1, and a stable operation can be realized. It is noted that a method for manufacturing the power semiconductor device according to this embodiment will be described later in detail in the fifth and sixth embodiment.

Next, a second embodiment of the invention is described.

Figure 3:
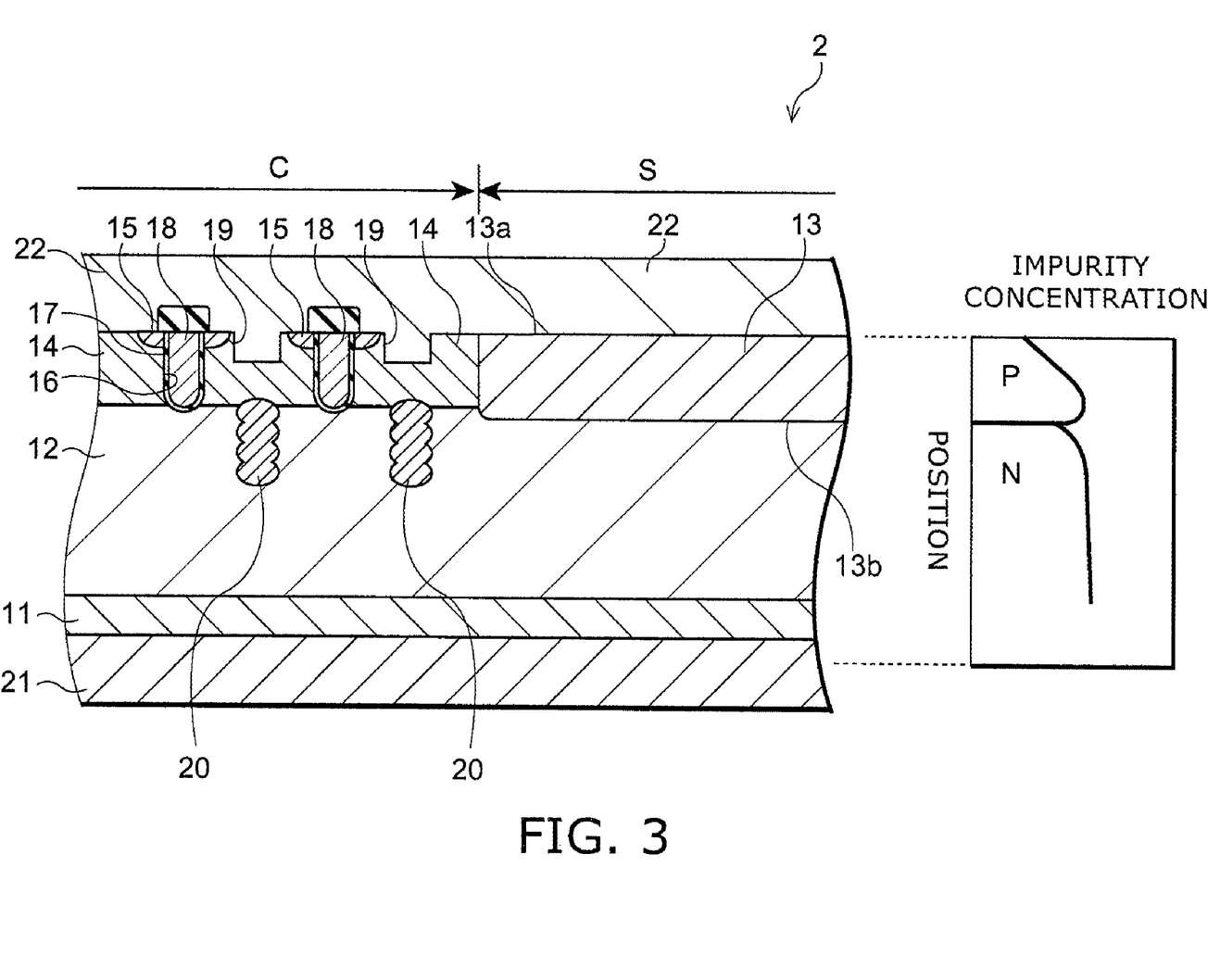
FIG. 3 is a cross-sectional view illustrating a power semiconductor device according to a second embodiment of the invention, and a graph illustrating the net impurity concentration profile of the guard ring layer and the epitaxial layer.

FIG. 3 shows a cross-sectional view illustrating a power semiconductor device according to this embodiment, and a graph illustrating the net impurity concentration profile of the guard ring layer and the epitaxial layer, where the vertical axis represents the position in the termination section of this power semiconductor device, and the horizontal axis represents the net impurity concentration.

As shown in FIG. 3, the power semiconductor device 2 according to this embodiment is different from the above first embodiment in the net impurity concentration profile of the guard ring layer 13. That is, in this embodiment, the P-type net impurity concentration in the guard ring layer 13 is generally sloped so as to be relatively high on the lower side and relatively low on the upper side. Consequently, the P-type net impurity concentration at the top surface 13a of the guard ring layer 13 is lower than the P-type net impurity concentration at the bottom surface 13b of the guard ring layer 13. More specifically, the P-type net impurity concentration in the guard ring layer 13 is slightly decreased near the bottom surface 13b because part of the P-type impurity diffuses into the epitaxial layer 12. Hence, the vertical net impurity concentration profile in the guard ring layer 13 is locally maximized at a position midway in the vertical direction and decreases therefrom in the upward and downward direction. However, as a whole, the net impurity concentration in the upper portion of the guard ring layer 13 is lower than the net impurity concentration in the lower portion thereof.

Thus, the depletion layer can be extended more reliably from the bottom surface 13b to the top surface 13a of the guard ring layer 13, and a high breakdown voltage can be obtained more reliably. The configuration, operation, and effect in this embodiment other than the foregoing are the same as those in the above first embodiment.

Next, a third embodiment of the invention is described.

Figure 4:
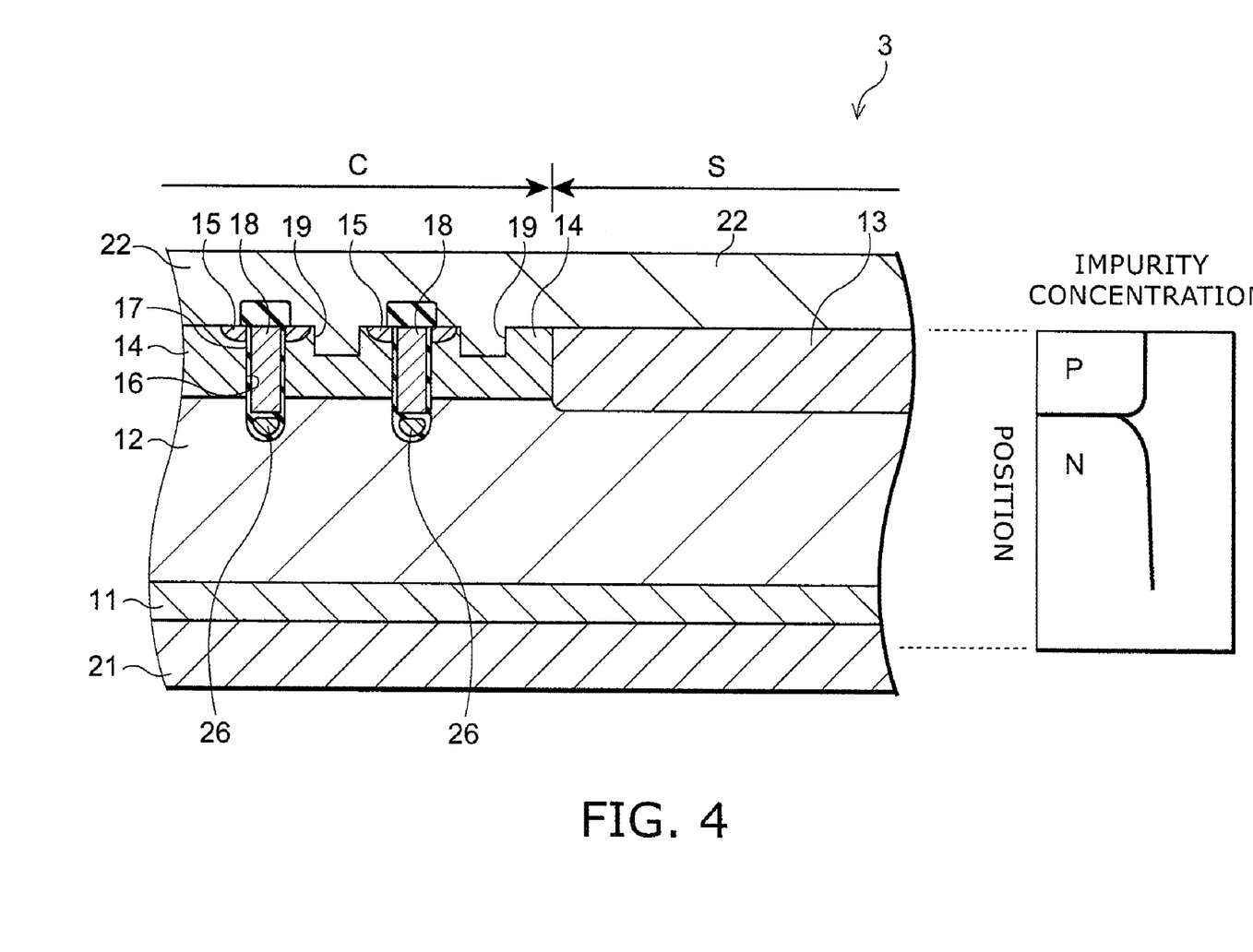
FIG. 4 is a cross-sectional view illustrating a power semiconductor device according to a third embodiment of the invention, and a graph illustrating the net impurity concentration profile of the guard ring layer and the epitaxial layer.

FIG. 4 shows a cross-sectional view illustrating a power semiconductor device according to this embodiment, and a graph illustrating the net impurity concentration profile of the guard ring layer and the epitaxial layer, where the vertical axis represents the position in the termination section of this power semiconductor device, and the horizontal axis represents the net impurity concentration.

As shown in FIG. 4, the power semiconductor device 3 according to this embodiment is different from the above first embodiment in the configuration of the cell section C. More specifically, no pillar layer 20 (see FIG. 1) is formed in the power semiconductor device 3. Furthermore, the gate trench 16 is formed more deeply, and a buried electrode 26 is buried in the lower portion of the gate trench 16. The control electrode 18 is buried in the upper portion of the gate trench 16 and insulated from the buried electrode 26 across an insulating film. Furthermore, the bottom surface of the control electrode 18 is located lower than the bottom surface of the base layer 14, and the buried electrode 26 is located inside the epitaxial layer 12. The buried electrode 26 is connected to the source electrode 21 in a portion not shown. Thus, a buried electrode structure is formed in the cell section C of the power semiconductor device 3 according to this embodiment.

On the other hand, in the termination section S, like the above first embodiment, a P-type guard ring layer 13 is formed on the epitaxial layer 12, and the vertical distribution of P-type net impurity concentration in guard ring layer 13 is generally constant. That is, the net impurity concentration at the top surface 13a of the guard ring layer 13 is generally equal to the net impurity concentration at the bottom surface 13b of the guard ring layer 13. The configuration, operation, and effect in this embodiment other than the foregoing are the same as those in the above first embodiment.

Next, a fourth embodiment of the invention is described.

Figure 5:
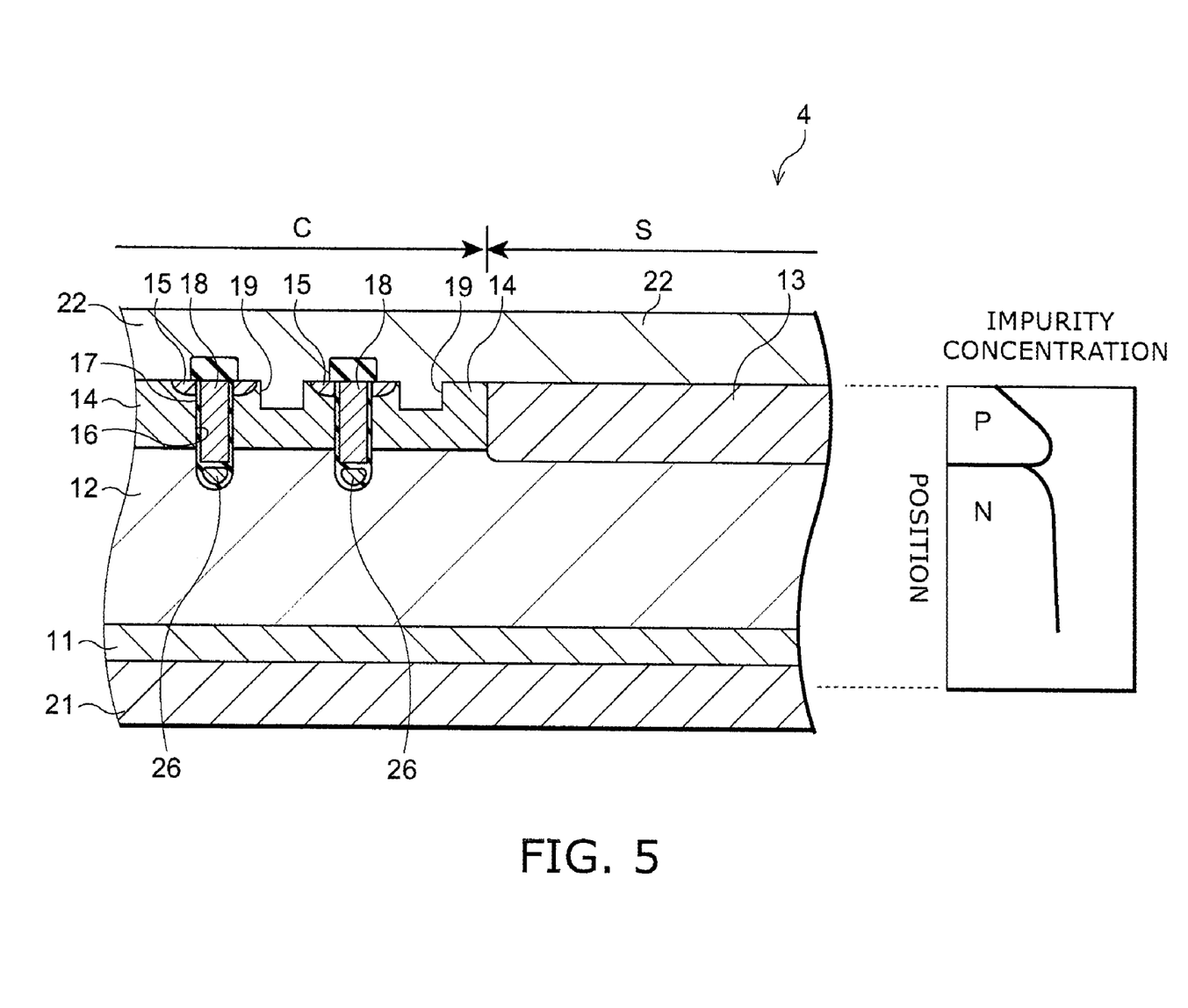
FIG. 5 is a cross-sectional view illustrating a power semiconductor device according to a fourth embodiment of the invention, and a graph illustrating the net impurity concentration profile of the guard ring layer and the epitaxial layer.

FIG. 5 shows a cross-sectional view illustrating a power semiconductor device according to this embodiment, and a graph illustrating the net impurity concentration profile of the guard ring layer and the epitaxial layer, where the vertical axis represents the position in the termination section of this power semiconductor device, and the horizontal axis represents the net impurity concentration.

As shown in FIG. 5, in the power semiconductor device 4 according to this embodiment, the cell section C has a buried electrode structure like the above third embodiment, and the termination section S has a structure like the above second embodiment in which the P-type net impurity concentration in the guard ring layer 13 is generally sloped so as to be relatively high on the lower side and relatively low on the upper side. This embodiment can also achieve the same effect as the above second embodiment.

Next, a fifth embodiment of the invention is described.

This embodiment relates to a method for manufacturing the power semiconductor device according to the above first and second embodiment.

Figure 6A:
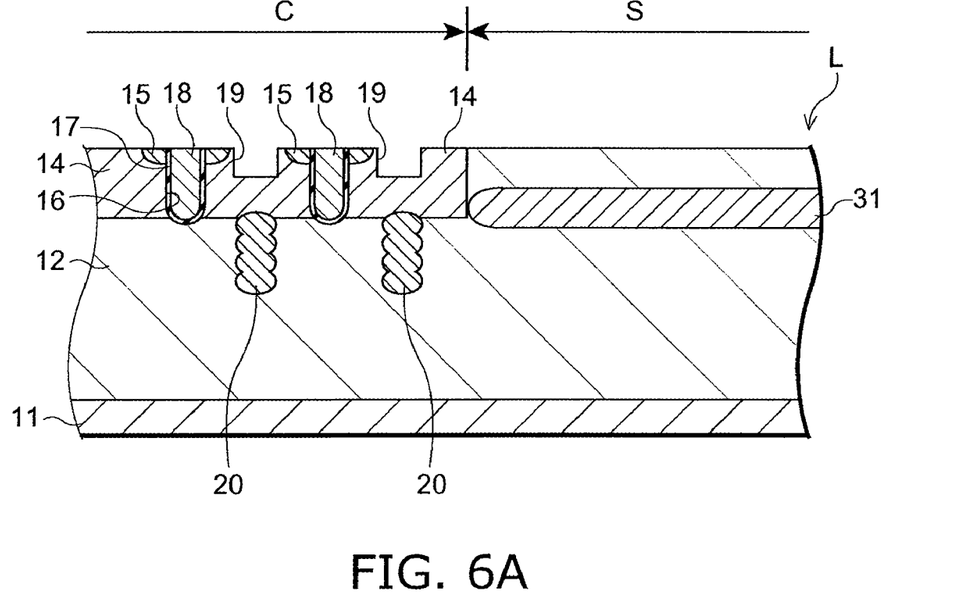
FIGS. 6A and 6B are process cross-sectional views illustrating the method for manufacturing a power semiconductor device according to this embodiment.
Figure 6B:
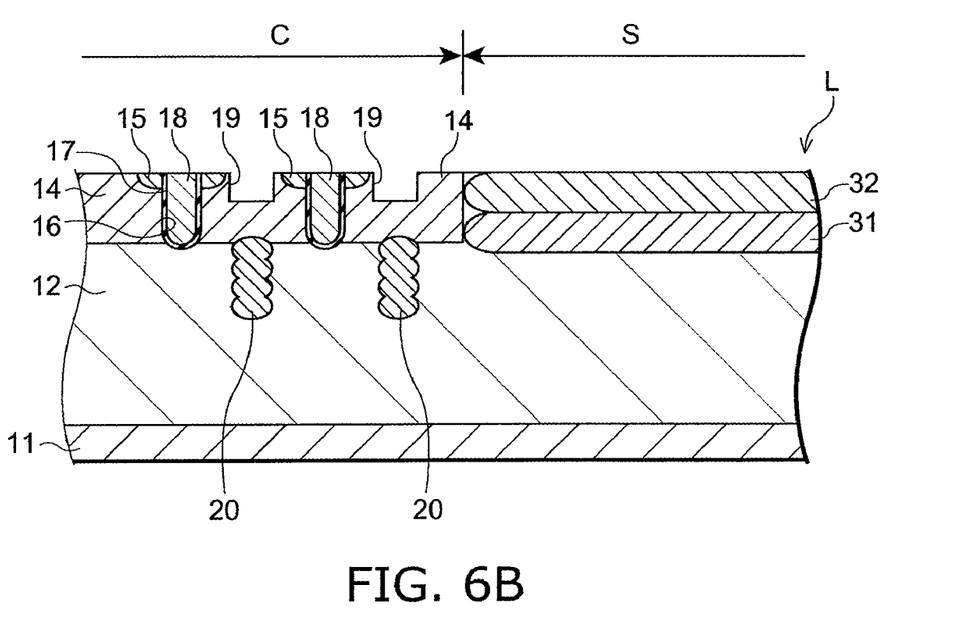

FIGS. 6A and 6B are process cross-sectional views illustrating the method for manufacturing a power semiconductor device according to this embodiment.

First, as shown in FIG. 1, an epitaxial layer 12 having N⁻-type conductivity is formed by epitaxial growth on the entire surface of a semiconductor substrate 11 having N⁺-type conductivity. A base layer 14 having P-type conductivity is formed on the epitaxial layer 12 in the cell section C. A source layer 15 having N-type conductivity is formed in part on the base layer 14. Furthermore, a gate trench 16, an insulating film 17, a control electrode 18, a source trench 19, and a pillar layer 20 are formed. The configuration of these components is as described in the above first embodiment. Thus, a laminated body L is fabricated.

Next, as shown in FIG. 6A, the termination section S of the laminated body L is subjected to the first round of implantation of P-type impurity (acceptor) to form a lower diffusion layer 31 having P-type conductivity. The bottom surface of this lower diffusion layer 31 is located lower than the bottom surface of the base layer 14, and the top surface of the lower diffusion layer 31 is located lower than the top surface of the epitaxial layer 12 before impurity implantation.

Next, as shown in FIG. 6B, the termination section S of the above laminated body L is subjected to the second round of implantation of P-type impurity (acceptor). The acceleration voltage at this time is lower than the acceleration voltage in the above first round of implantation. The dose amount is also lower than the dose amount in the first round of implantation. Thus, an upper diffusion layer 32 having an net impurity concentration not more than the net impurity concentration in the lower diffusion layer 31 is formed on the lower diffusion layer 31.

Next, by activation heat treatment, the P-type impurity contained in the lower diffusion layer 31 and the upper diffusion layer 32 is activated to form a guard ring 13. Here, as described in the above first or second embodiment, the vertical net impurity concentration profile in the guard ring 13 is generally sloped so as to be relatively high on the lower side and relatively low on the upper side, or is constant. Subsequently, a source electrode 21 and a drain electrode 22 are formed. Thus, the power semiconductor device according to the above first or second embodiment can be manufactured.

In the following, a simulation result with regard to the dose amount for the lower diffusion layer 31 and the upper diffusion layer 32 in this embodiment is described.

Figure 7:
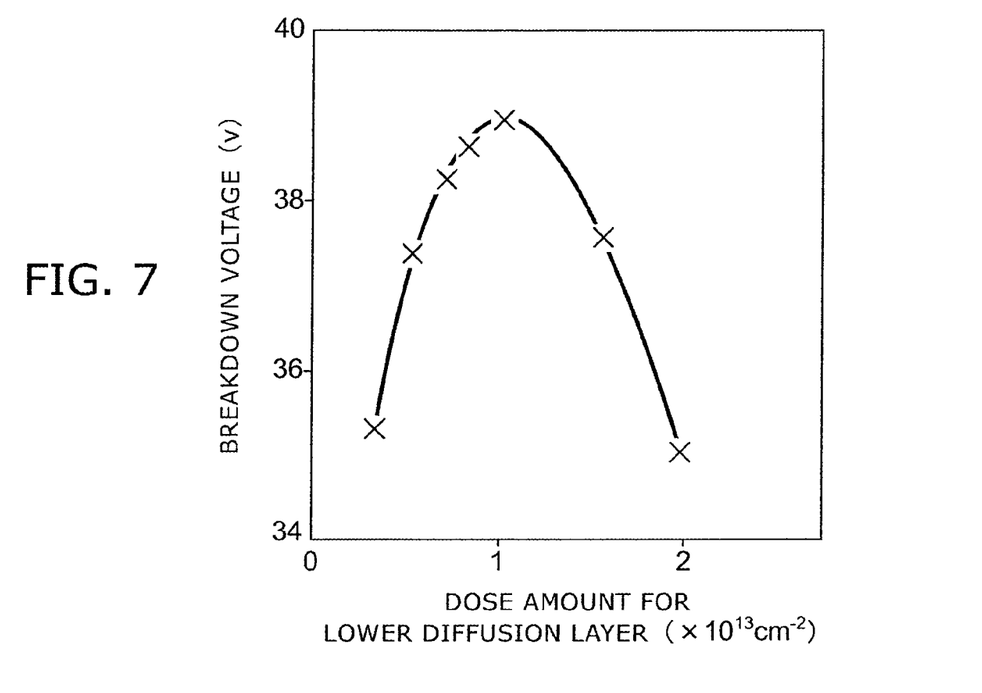
FIG. 7 is a graph illustrating a simulation result for the effect of the dose amount for the lower diffusion layer exerted on the breakdown voltage of the termination section.

FIG. 7 is a graph illustrating a simulation result for the effect of the dose amount for the lower diffusion layer exerted on the breakdown voltage of the termination section, where the horizontal axis represents the dose amount for the lower diffusion layer, and the vertical axis represents the breakdown voltage of the termination section.

FIG. 7 shows the result of a simulation in which vertical MOSFETs were fabricated with different dose amounts for the lower diffusion layer 31 and the breakdown voltage of the termination section thereof was measured. In this simulation, the implantation energy for the lower diffusion layer 31 was 450 keV, the implantation energy for the upper diffusion layer 32 was 100 keV, and the dose amount for the upper diffusion layer 32 was $5 \times 10^{12}$ cm$^{-2}$.

As shown in FIG. 7, the breakdown voltage of the termination section was locally maximized when the dose amount for the lower diffusion layer 31 was approximately $1 \times 10^{13}$ cm$^{-2}$. This is presumably because, when the dose amount for the lower diffusion layer 31 was too small, the depletion layer was difficult to extend downward, that is, toward the inside of the epitaxial layer 12, from the interface (bottom surface 13b) between the epitaxial layer 12 and the guard ring layer 13, whereas when the dose amount for the lower diffusion layer 31 was too large, the depletion layer was difficult to extend upward, that is, toward the inside of the guard ring layer 13, from the interface between the epitaxial layer 12 and the guard ring layer 13.

Figure 8:
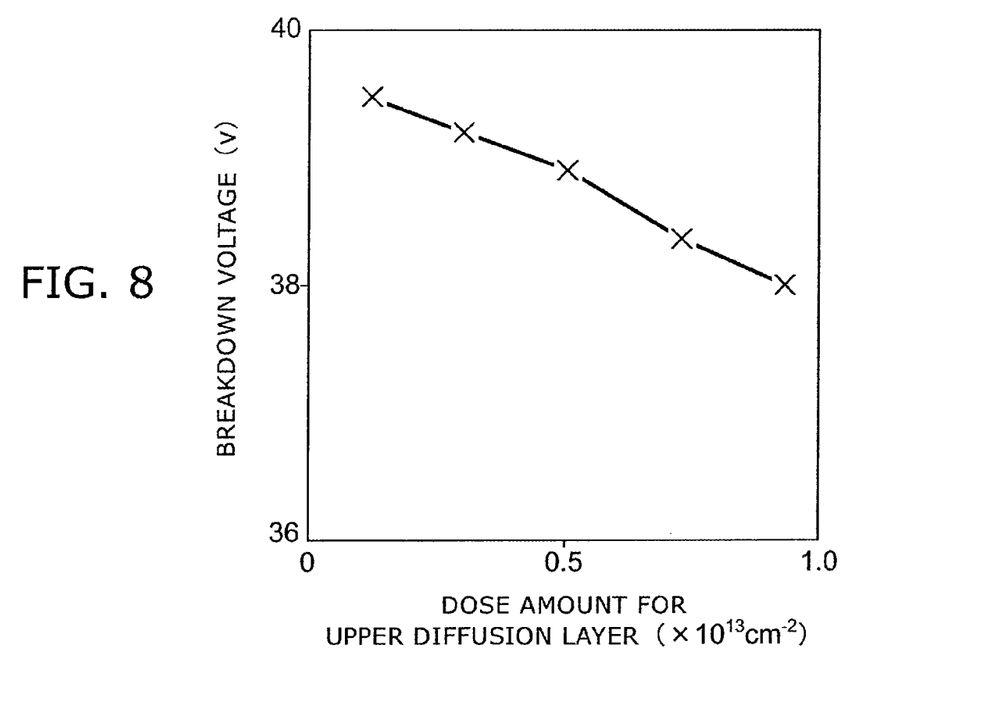
FIG. 8 is a graph illustrating a simulation result for the effect of the dose amount for the upper diffusion layer exerted on the breakdown voltage of the termination section.

FIG. 8 is a graph illustrating a simulation result for the effect of the dose amount for the upper diffusion layer exerted on the breakdown voltage of the termination section, where the horizontal axis represents the dose amount for the upper diffusion layer, and the vertical axis represents the breakdown voltage of the termination section.

FIG. 8 shows the result of a simulation in which vertical MOSFETs were fabricated with different dose amounts for the upper diffusion layer 32 and the breakdown voltage of the termination section thereof was measured. In this simulation, the dose amount for the lower diffusion layer 31 was $1 \times 10^{13}$ cm$^{-2}$, the implantation energy for the lower diffusion layer 31 was 450 keV, and the implantation energy for the upper diffusion layer 32 was 100 keV.

As shown in FIG. 8, the breakdown voltage was increased with the decrease of the dose amount for the upper diffusion layer 32. This is presumably because the decrease of the dose amount for the upper diffusion layer 32 allowed the depletion layer to extend more easily into the guard ring layer 13.

Thus, it was found that the dose amount for the lower diffusion layer 31 has an optimum value, at which the breakdown voltage is locally maximized, in relation to the depletion layer extending to both the epitaxial layer 12 and the guard ring layer 13. On the other hand, the breakdown voltage was increased with the decrease of the dose amount for the upper diffusion layer 32. In other words, for the lower diffusion layer 31, a certain dose amount is needed to sufficiently extend the depletion layer into the epitaxial layer 12 and to ensure the function of the guard ring. However, the dose amount for the upper diffusion layer 32 is preferably small to sufficiently extend the depletion layer into the guard ring layer 13. Hence, the dose amount for the upper diffusion layer 32 needs to be smaller than the dose amount for the lower diffusion layer 31.

Next, a sixth embodiment of the invention is described.

This embodiment relates to a method for manufacturing the power semiconductor device according to the above first or second embodiment.

Figure 9A:
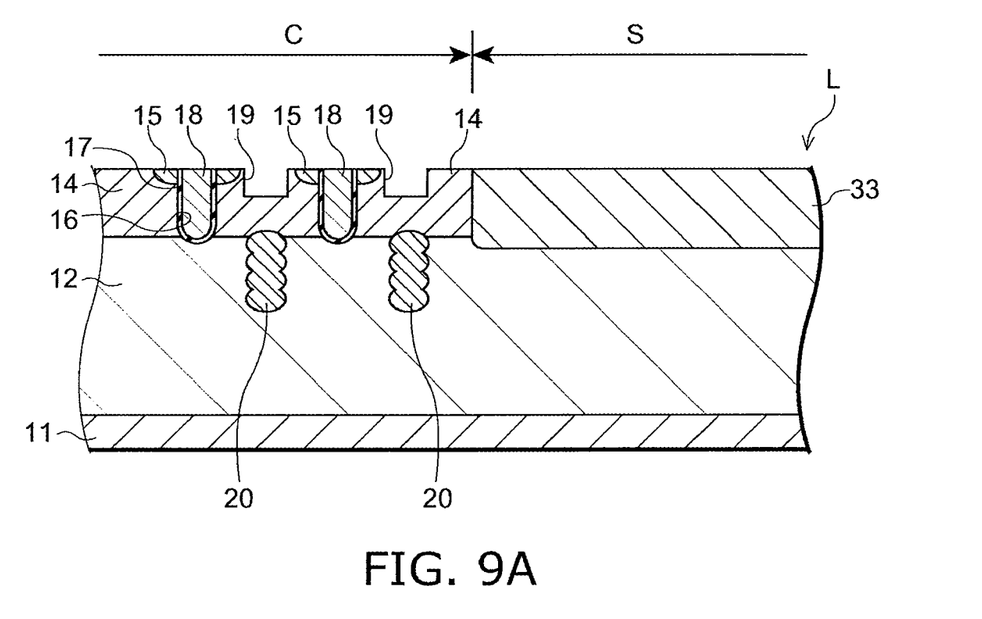
FIGS. 9A and 9B are process cross-sectional views illustrating the method for manufacturing a power semiconductor device according to this embodiment.
Figure 9B:
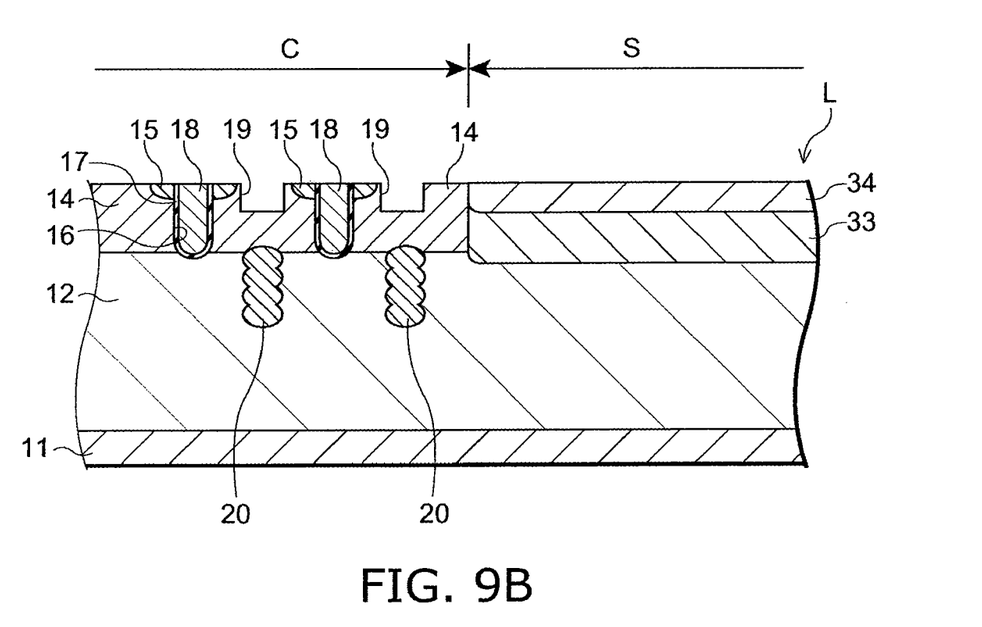

FIGS. 9A and 9B are process cross-sectional views illustrating the method for manufacturing a power semiconductor device according to this embodiment.

First, like the above fifth embodiment, an epitaxial layer 12, a base layer 14, a source layer 15, a gate trench 16, an insulating film 17, a control electrode 18, a source trench 19, and a pillar layer 20 are formed on a semiconductor substrate 11 to fabricate a laminated body L.

Next, as shown in FIG. 9A, the termination section S of the laminated body L is subjected to implantation of P-type impurity (acceptor) to form a P-type diffusion layer 33. This P-type diffusion layer 33 is formed over the entire region where a guard ring layer 13 is to be formed in the subsequent process. That is, the top surface of the P-type diffusion layer 33 is located as high as the top surface of the base layer 14, and the bottom surface of the P-type diffusion layer 33 is located lower than the bottom surface of the base layer 14.

Next, as shown in FIG. 9B, the termination section S of this laminated body L is subjected to implantation of N-type impurity (donor). The dose amount of N-type impurity at this time is smaller than the dose amount of P-type impurity in the implantation of P-type impurity in the above step shown in FIG. 9A, and the acceleration voltage is adjusted to implant N-type impurity into the upper portion 34 of the P-type diffusion layer 33.

Next, by activation heat treatment, the P-type impurity contained in the P-type diffusion layer 33 and the N-type impurity subsequently implanted into the upper portion 34 are activated to form a guard ring 13. Part of the P-type impurity in the upper portion 34 of the P-type diffusion layer 33 is canceled by the subsequently implanted N-type impurity to decrease the net concentration of P-type impurity. Consequently, as described in the above first or second embodiment, the vertical net impurity concentration profile in the guard ring 13 is generally sloped so as to be relatively high on the lower side and relatively low on the upper side, or is constant. Subsequently, a source electrode 21 and a drain electrode 22 are formed. Thus, the power semiconductor device according to the above first or second embodiment can be manufactured.

The above fifth and sixth embodiment have described an example of manufacturing the power semiconductor device having the SJ structure according to the above first and second embodiment. However, a similar method can be also used to manufacture the power semiconductor device having the buried electrode structure according to the above third and fourth embodiment.

Next, a comparative example of the invention is described.

Figure 10:
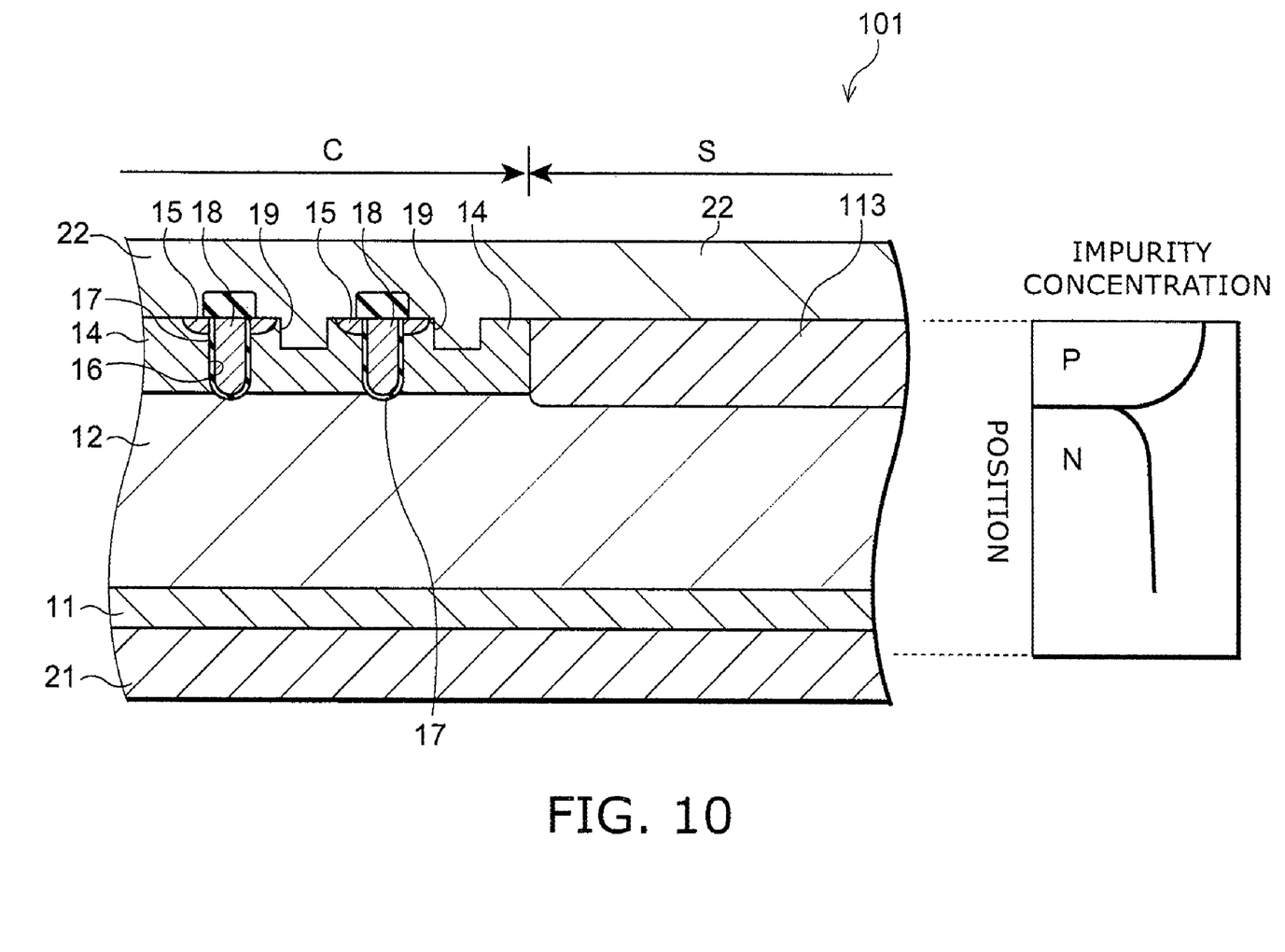
FIG. 10 shows a cross-sectional view illustrating a power semiconductor device according to this comparative example of the invention, and a graph illustrating the net impurity concentration profile of the guard ring layer and the epitaxial layer.

FIG. 10 shows a cross-sectional view illustrating a power semiconductor device according to this comparative example, and a graph illustrating the net impurity concentration profile of the guard ring layer and the epitaxial layer, where the vertical axis represents the position in the termination section of this power semiconductor device, and the horizontal axis represents the net impurity concentration.

As shown in FIG. 10, in the power semiconductor device 101 according to this comparative example, a guard ring layer 113 having P-type conductivity is formed in the termination section S. This guard ring layer 113 is formed by one-time implantation of P-type impurity followed by activation heat treatment. In this case, the implanted P-type impurity is diffused to the surface by the activation heat treatment. Hence, in the vertical net concentration profile of P-type impurity in the guard ring layer 113, the net concentration increases in the upward direction. Thus, as described above with reference to FIGS. 2C and 2D, even if a voltage is applied between the source and the drain, the depletion layer does not sufficiently extend into the guard ring layer 113, and the breakdown voltage of the termination section S decreases.

The invention has been described with reference to the embodiments. However, the invention is not limited to these embodiments. For example, any addition, deletion, or design change of components, or any addition, omission, or condition change of steps in the above embodiments suitably made by those skilled in the art are also encompassed within the scope of the invention as long as they fall within the spirit of the invention. For example, a contact layer having high impurity concentration can be formed in the lower end portion of the source trench. In the examples described in the above embodiments, the semiconductor substrate, the epitaxial layer, and the source layer have N-type conductivity, whereas the base layer and the guard ring layer have P-type conductivity. However, these conductivity types can be reversed. Furthermore, the power semiconductor device according to the invention is not limited to the vertical MOSFET, but is applicable to any vertical power devices.

The invention claimed is:
1. A vertical power semiconductor device comprising:
a first semiconductor layer of a first conductivity type formed in both a cell section and a termination section, the termination section surrounding the cell section;
a second semiconductor layer of a second conductivity type formed on the first semiconductor layer in the cell section;
a third semiconductor layer of the first conductivity type formed in part on the second semiconductor layer; and
a guard ring layer of the second conductivity type formed on the first semiconductor layer in the termination section,
net impurity concentration in the guard ring layer being generally sloped so as to be relatively high on its lower side and relatively low on its upper side, or being constant, and
a bottom surface of the second semiconductor layer being located higher than a bottom surface of the guard ring layer.

2. The device according to claim 1, wherein the net impurity concentration at the top surface of the guard ring layer is equal to the net impurity concentration at the bottom surface of the guard ring layer.

3. The device according to claim 1, further comprising:
a semiconductor substrate of the first conductivity type, the first semiconductor layer being formed on the semiconductor substrate.

4. The device according to claim 3, further comprising:
a source electrode made of a metal or an alloy and connected to the guard ring layer, the second semiconductor layer, and the third semiconductor layer; and
a drain electrode made of a metal or an alloy and connected to the semiconductor substrate.

5. The device according to claim 1, wherein a trench penetrating the third semiconductor layer and the second semiconductor layer and reaching the first semiconductor layer is formed in the third semiconductor layer, the second semiconductor layer, and the first semiconductor layer,
the power semiconductor device further comprising:
an insulating film formed on an inner surface of the trench; and
a control electrode buried in the trench.

6. The device according to claim 1, further comprising:
a plurality of pillar layers of the second conductivity type formed in the first semiconductor layer, the pillar layers being spaced from each other and arrayed along a direction parallel to the top surface of the first semiconductor layer, and being connected to the second semiconductor layer.

7. The device according to claim 6, wherein a net amount of second-conductivity-type impurity contained in each of the pillar layers is equal to a net amount of first-conductivity-type impurity contained in each region between the pillar layers.

8. The device according to claim 6, further comprising:
a semiconductor substrate of the first conductivity type;
a source electrode made of a metal or an alloy and connected to the guard ring layer, the second semiconductor layer, and the third semiconductor layer; and
a drain electrode made of a metal or an alloy and connected to the semiconductor substrate,
the first semiconductor layer being formed on the semiconductor substrate.

9. The device according to claim 1, wherein the net impurity concentration at the top surface of the guard ring layer is lower than the net impurity concentration at the bottom surface of the guard ring layer.

10. The device according to claim 1, wherein
the guard ring layer has a vertical net impurity concentration profile which is locally maximized at a position midway in the vertical direction and decreases therefrom in the upward and downward direction, and the net impurity concentration in an upper portion of the guard ring layer is lower than the net impurity concentration in a lower portion thereof.

11. The device according to claim 1, wherein a trench penetrating the third semiconductor layer and the second semiconductor layer and reaching the first semiconductor layer is formed in the third semiconductor layer, the second semiconductor layer, and the first semiconductor layer, the power semiconductor device further comprising:
an insulating film formed on an inner surface of the trench;
a buried electrode formed in a lower portion of the trench; and
a control electrode buried in an upper portion of the trench.

12. The device according to claim 11, further comprising:
a semiconductor substrate of the first conductivity type;
a source electrode made of a metal or an alloy and connected to the guard ring layer, the second semiconductor layer, and the third semiconductor layer; and
a drain electrode made of a metal or an alloy and connected to the semiconductor substrate,
the first semiconductor layer being formed on the semiconductor substrate, and
the buried electrode is connected to the source electrode.

* * * * *